(12) United States Patent
Basson

(10) Patent No.: US 9,911,571 B2
(45) Date of Patent: Mar. 6, 2018

(54) HIGH VOLTAGE ELECTRON BEAM SYSTEM AND METHOD

(71) Applicant: APPLIED MATERIALS ISRAEL LTD., Rehovot (IL)

(72) Inventor: Yosef Basson, Holon (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/486,880

(22) Filed: Apr. 13, 2017

(65) Prior Publication Data

US 2017/0309442 A1    Oct. 26, 2017

Related U.S. Application Data

(60) Provisional application No. 62/325,391, filed on Apr. 20, 2016.

(51) Int. Cl.

| | |
|---|---|
| *G01F 23/00* | (2006.01) |
| *H01J 37/20* | (2006.01) |
| *H01J 37/18* | (2006.01) |
| *H01J 37/248* | (2006.01) |
| *H01J 37/28* | (2006.01) |

(52) U.S. Cl.
CPC .............. *H01J 37/20* (2013.01); *H01J 37/18* (2013.01); *H01J 37/248* (2013.01); *H01J 37/28* (2013.01)

(58) Field of Classification Search
CPC .. H01J 37/00; H01J 37/02; H01J 37/16; H01J 37/20
USPC .............. 250/306, 307, 311, 440.11, 441.11
See application file for complete search history.

(56) References Cited

U.S. PATENT DOCUMENTS

| | | | |
|---|---|---|---|
| 2012/0223228 A1* | 9/2012 | Galloway | G01N 1/06 250/310 |
| 2012/0256087 A1* | 10/2012 | Kanno | H01J 37/20 250/310 |

\* cited by examiner

*Primary Examiner* — Jason McCormack
(74) *Attorney, Agent, or Firm* — Kilpatrick Townsend & Stockton LLP

(57) ABSTRACT

A high voltage inspection system that includes a vacuum chamber; electron optics that is configured to direct an electron beam towards an upper surface of a substrate; a substrate support module that comprises a chuck and a housing; wherein the chuck is configured to support a substrate; wherein the housing is configured to surround the substrate without masking the electron beam, when the substrate is positioned on the chuck during a first operational mode of the high voltage inspection system; and wherein the substrate, the chuck and the housing are configured to (a) receive a high voltage bias signal of a high voltage level that exceeds ten thousand volts, and (b) to maintain at substantially the high voltage level during the first operational mode of the high voltage inspection system.

20 Claims, 16 Drawing Sheets

HIGH VOLTAGE ELECTRON BEAM SYSTEM AND METHOD

CROSS-REFERENCE TO RELATED APPLICATIONS

This application claims the benefit of U.S. Provisional Patent Application No. 62/325,391, filed Apr. 20, 2016, the entire contents of which are incorporated herein by reference in their entirety for all purposes.

BACKGROUND

Scanning electron microscopes review an object with a charged electron beam. The electrons of the charged electron beam are accelerated by an acceleration voltage.

Increasing the acceleration voltage may provide various benefits but may expose the scanning electron microscope to the formation of arcs, breakdowns and other hazards that accompany high voltage devices.

There is a growing need to reduce the hazards associated with high voltage in a scanning electron microscope.

SUMMARY

According to an embodiment of the invention there may be provided a high voltage inspection system, modules of the high voltage inspection system and a method for inspecting using the high voltage inspection system. The inspection system may be used for inspection, metrology, and the like.

BRIEF DESCRIPTION OF THE DRAWINGS

The objects, features, and advantages of embodiments described herein may best be understood by reference to the following detailed description when read with the accompanying drawings in which.

Figure 1:
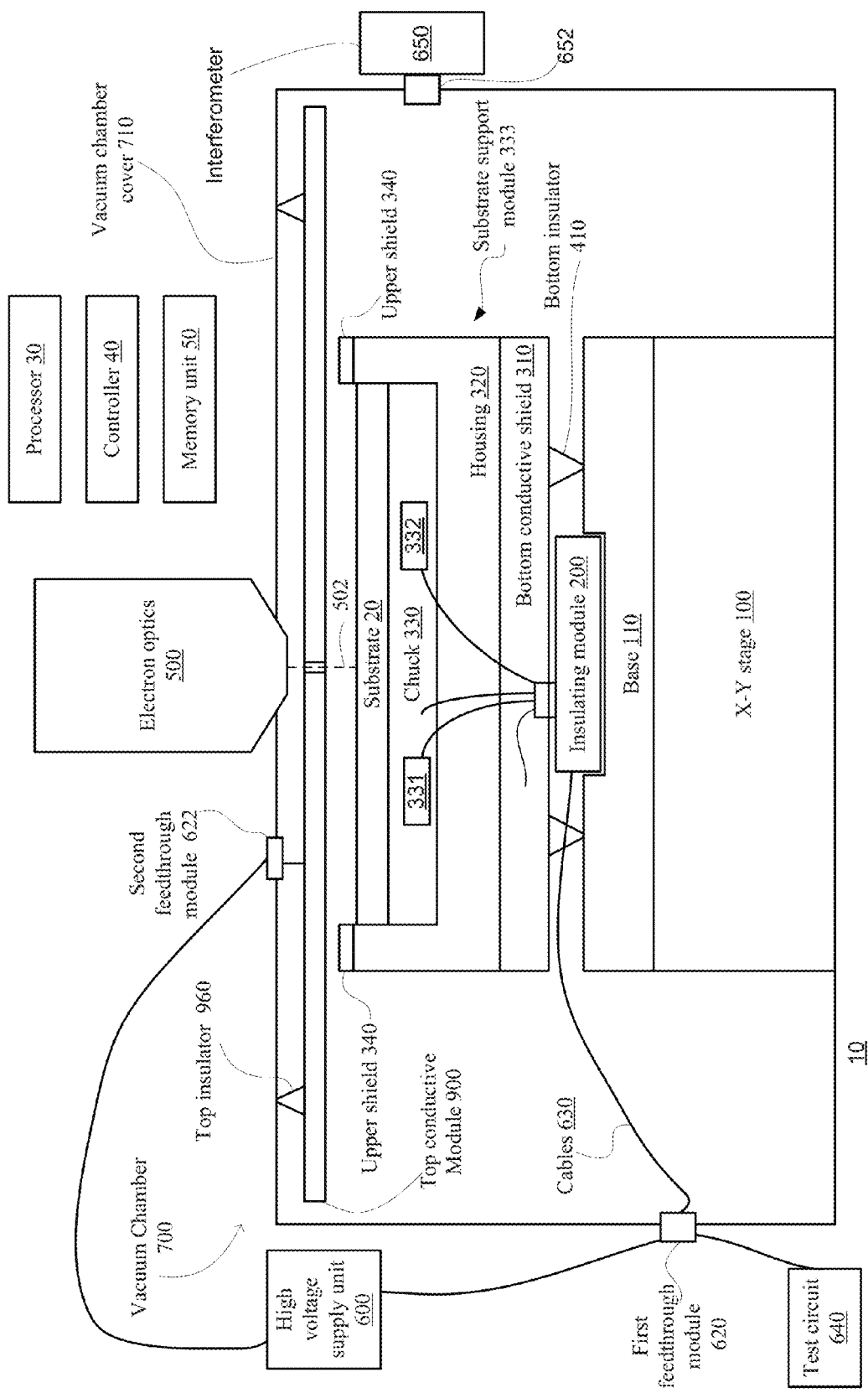
FIG. 1 is a cross sectional view of a substrate and a high voltage inspection system according to an embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the embodiments described herein. However, it will be understood by those skilled in the art that the various embodiments may be practiced without these specific details. In other instances, well-known methods, procedures, and components have not been described in detail so as not to obscure other features.

Because some embodiments may, for the most part, be implemented using electronic components and circuits known to those skilled in the art, details will not be explained in any greater extent than considered necessary for the understanding and appreciation of the underlying concepts and in order not to obfuscate or distract from the teachings described herein.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The term "high voltage" refers to voltage levels that exceed 10000 volts and may reach, for example, 20000 volts, 30000 volts, or more.

FIG. 1 is a cross sectional view of a substrate 20 and a high voltage inspection system 10 according to an embodiment.

The high voltage inspection system 10 is illustrated as including processor 30, controller 40, memory unit 50, X-Y stage 100, base 110, insulating module 200, substrate support module 333, bottom insulator 410, electron optics 500, high voltage supply unit 600, first feedthrough module 620, second feedthrough module 622, cables 630, test circuit 640, interferometer 650, interferometer window 652, vacuum chamber 700, top conductive unit 900 and top insulator 960.

Processor 30 may be configured to process detection signals from the electron optics 500. Processor 30 may generate and/or analyze images.

Controller 40 may control the operation of the high voltage inspection system 10.

Memory unit 50 may store commands, recipes, images of the substrate, reference images and the like.

The electron optics 500 may be a column but other types of electron optics may be provided.

The substrate support module 333 includes bottom conductive shield 310, housing 320, chuck 330 and upper shield 340. The housing 320 is positioned between the bottom conductive shield 310 and the upper shield 340.

The housing 320 may include sidewalls that are coated with light reflecting and electrically conducting materials to form mirrors that are used by interferometer 650 to detect the location of the housing 320. Light beams from interferometer 650 pass through interferometer opening 652, impinge on the sidewalls of the housing and are reflected to the interferometer 650. The high voltage inspection system 10 may include an additional interferometer (not shown) that illuminates another sidewall of the housing.

The location information obtained by the interferometer 650 may be used by controller 40 to control the movement of the X-Y stage 100. The X-Y stage 100 may be replaced by a X-Y-Z stage and/or by a rotating stage in some embodiments.

In order to guarantee the accuracy of the location determination, the mirrors should not be deformed due to heat changes. The lack of deformation may be achieved by using a housing that includes a core that is made of an extremely low expansion material such as a glass ceramic like ZERODUR™ of Schott. Other extremely low expansion materials may be used.

Because a core that is made of ZERODUR™ is fragile—the housing may be mechanically shielded and/or protected by an upper shield 340 positioned on top of the housing 320 and a bottom shield 310 positioned below the housing 320.

One or more shields of upper shield 340 and bottom shield 310 may be integrated with the housing 320. Both upper shield 340 and bottom shield 310 are made of electrically conductive materials.

The housing 320 may be coated with electrically conductive material and/or may include an electrically conductive envelope. Parts of the exterior of the housing that are not used as a mirror may or may not reflect light.

The high voltage inspection system 10 may inspect the substrate 20 when operating at a first operational mode.

During other operational modes, the high voltage inspection system 10 may perform maintenance operations (such as plasma cleaning), may perform vacuum pumping, may inspect the substrate 20 using an optical microscope (denoted 510 in FIG. 2), may insert the substrate 20 into the vacuum chamber 700, may position the substrate 20 on the chuck 330, may remove the substrate 20 from the chuck 330, and may evacuate the substrate 20 from the vacuum chamber 700. The substrate 20 may be manipulated by a robot or any other unit known in the art.

The chuck 330 may be any known chuck. The chuck may use electrostatic force, vacuum and/or any other known method to hold the substrate 20.

The chuck 330 can also be made of an electrically conductive material or may include an electrically conductive exterior or an electrically conductive upper part.

When the high voltage inspection system 10 operates at the first operational mode the substrate 20 is surrounded by the chuck 330 and the housing 320. The sidewall of the substrate 20 is surrounded by the housing 320.

Both the chuck 330 and the housing 320 may be substantially maintained at a given high voltage level regardless of the motion of the X-Y stage 100.

A top conductive unit 900 is positioned above the substrate 20. When the high voltage inspection system 10 operates at the first operational mode, the substrate 20 is proximate to the top conductive unit 900. The distance between substrate 20 and the top conductive unit 900 may be millimetric or below a predefined distance threshold.

When the high voltage inspection system 10 operates at the first operational, the X-Y stage 100 may move the substrate support module 333 (and accordingly move the substrate 20) in order to expose different areas of the substrate to the electron beam 502.

The top conductive unit 900 may be static but is shaped and sized to "cover" the entire movement of the substrate, so that regardless of the position of the substrate 20, the substrate is positioned below the top conductive unit 900.

The phrase "substantially maintained at the given high voltage level" may include maintained at the exact given high voltage level but may also allow small deviations from the given high voltage level. A small deviation may be, for example, a deviation that does not exceed 1-5 percent of the given high voltage level.

When the high voltage inspection system 10 operates at the first operational mode—even if the substrate 20 is moved from one location to another—the substrate 20 is surrounded by the same high voltage environment. The top conductive unit 900, the housing 320 and the chuck 330 may be substantially maintained at the given high voltage level.

According to an embodiment, the chuck 330 is an electrostatic chuck that includes a positive electrode 331 and a negative electrode 332. The positive and negative electrodes may be of any shape and size. The positive electrode 331 receives a positive electrode bias signal and the negative electrode 332 receives a negative electrode bias signal. The positive electrode bias signal and/or the negative electrode bias signal may deviate from the given high voltage level in order to allow the chuck 330 to apply an electromagnetic chucking force on the substrate 20.

Surrounding the substrate 20 by the same high voltage environment may dramatically reduce the probability of high voltage breakdowns.

The vacuum chamber 700 may be grounded (or at least maintained in a low voltage).

The top conductive unit 900 is mechanically connected to a vacuum chamber cover 710 and is electrically insulated from the vacuum chamber cover 710 by a top insulating interface that includes top insulators 960.

Each top insulator 960 may include a set of coaxial insulating rings of descending size. Higher rings of the set have a smaller size. Each top insulator reduces creepage.

The top conductive unit 900 receives high voltage bias signals through a second feedthrough module 622 positioned at the cover of the vacuum chamber.

The insulating module 200 is positioned on top of a base 110. Base 110 is positioned above X-Y stage 100.

The bottom of the bottom conductive shield 310 may be smooth and face the upper surface of base 110. The upper surface of base 110 may also be smooth.

A bottom insulating interface may include a bottom insulator that mechanically couples the base 110 to the bottom conductive shield 310 and also electrically insulates the base 110 from the bottom conductive shield 310.

The base 110 may be maintained at a low voltage while the bottom conductive shield 310 is substantially maintained at the given high voltage level.

An upper surface of base 110 faces the bottom surface of the bottom conductive shield 310. In order to reduce the chances of a formation of an arc between the base 110 and the bottom conductive shield 310, the upper surface of the base 110 and the bottom surface of bottom conductive shield 310 may be smooth.

Each bottom insulator 410 may include a set of coaxial insulating rings of ascending size. Lower rings of the set have a smaller size. Each bottom insulator reduces creepage.

According to an embodiment, the insulating module 200 receives four cables. A first cable conveys a test signal that is sent to the chuck 330 in order to determine if there is a Ohmic contact between the chuck 330 and the substrate 20. The test signal may be provided from test circuit 640 that is positioned outside the vacuum chamber.

A second cable may convey a bias signal of the given high voltage level. This bias signal may be provided to one or more of the housing 320, the bottom conductive shield 320 and the upper shield 340. The housing 320, the bottom conductive shield 320 and the upper shield 340 are electrically coupled to each other by means of conductors, mechanical coupling and the like.

Third and fourth cables convey the positive electrode bias signal and the negative electrode bias signal, respectively.

It is noted that the number of cables may differ from four, and that more than a single high bias voltage signal may be provided to the housing 320, the bottom conductive shield 320 and/or the upper shield 340.

Figure 2:
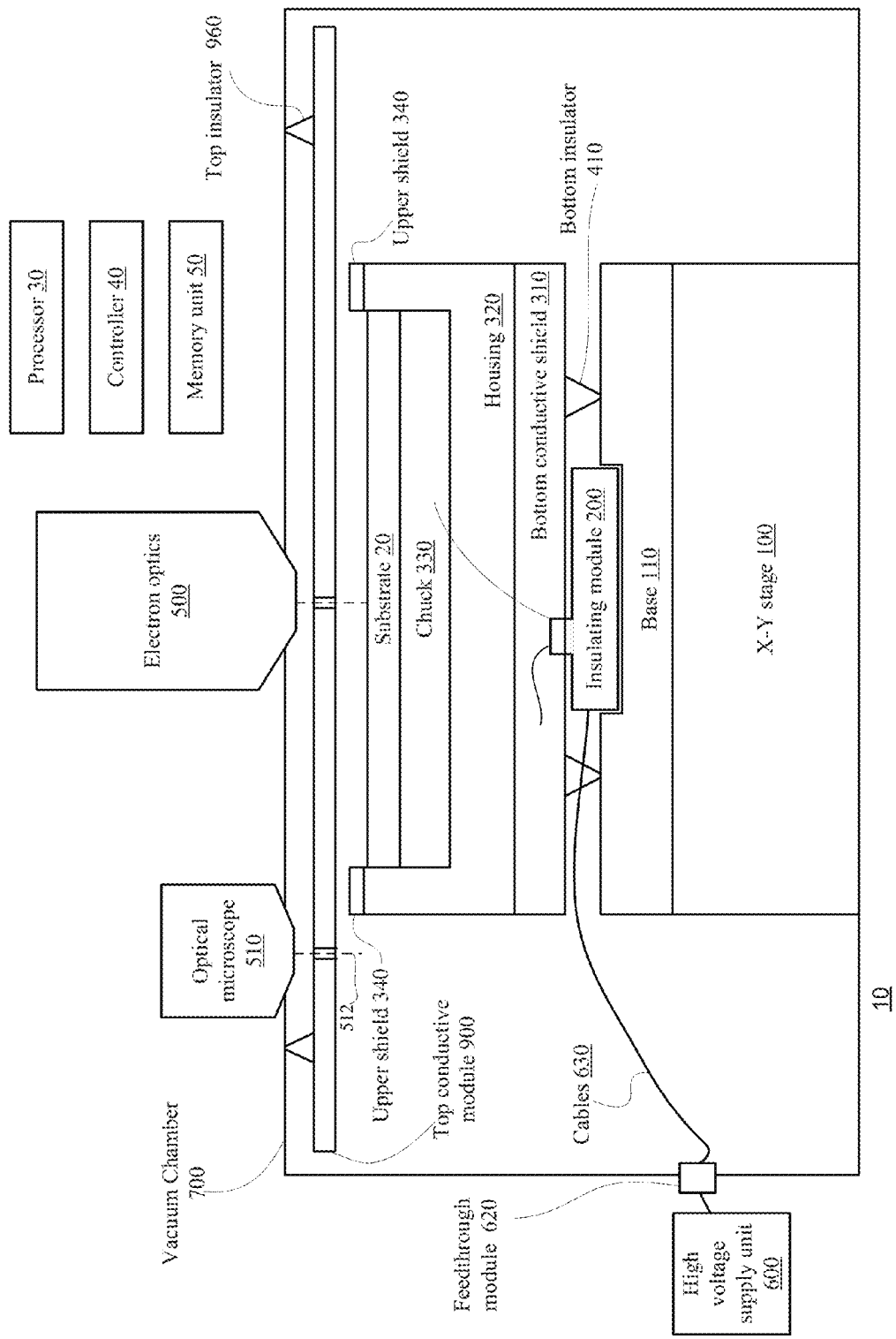
FIG. 2 is a cross sectional view of a substrate and a high voltage inspection system according to an embodiment.

FIG. 2 is a cross sectional view of a substrate 20 and a high voltage inspection system 10 according to an embodiment.

Some of the components of FIG. 1 have been removed for brevity of explanation.

The high voltage inspection system 10 of FIG. 2 includes an optical microscope 510 that is configured to direct a light beam 512 towards the substrate 20. The light beam 512 propagates through a window formed in the cover of the vacuum chamber and through an aperture formed in the top conductive module 900. The optical microscope 510 and the electron optics 500 are spaced apart from each other. According to an embodiment, the fields of view of the optical microscope 510 and the electron optics 500 are spaced apart from each other.

Figure 3:
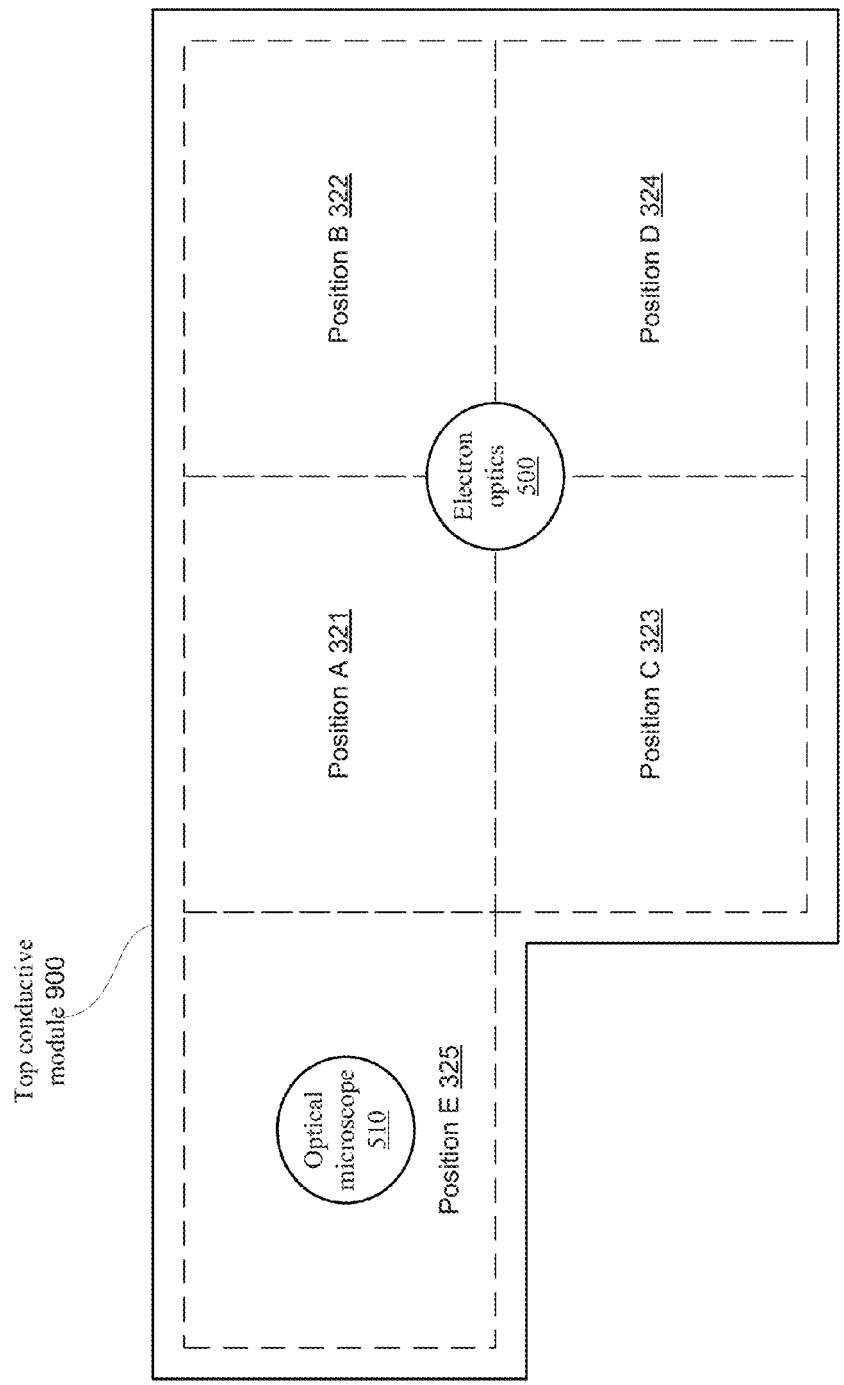
FIG. 3 is a top view of top conductive module, optical microscope electron optics and different positions of the housing according to various embodiments.

FIG. 3 is a top view of a top conductive module 900, an optical microscope 510, electron optics 500 and different positions of the housing according to various embodiments.

Assuming that each point of the substrate 20 should be imaged by the electron optics 500, the housing 320 should move between different positions. The rear-leftmost position of the housing 320 is denoted Position A 321. The rear-rightmost position of the housing 320 is denoted Position B 322. The front-leftmost position of the housing 320 is denoted Position C 323. The front-rightmost position of the housing 320 is denoted Position D 324.

The position of the substrate 20 when imaged by the optical microscope is denoted Position E 325.

FIG. 3 illustrates that in all of the positions of the housing 320, the top conductive module 900 may be directly above the housing (and the substrate 20). The phrase "directly above" means that a projection of the top conductive module 900 on the plane of the substrate 20 when the projection lines are vertical "falls" on the substrate 20.

Therefore, during the first operational mode of the high voltage inspection system, the substrate 20 will see the same high voltage environment.

Figure 4:
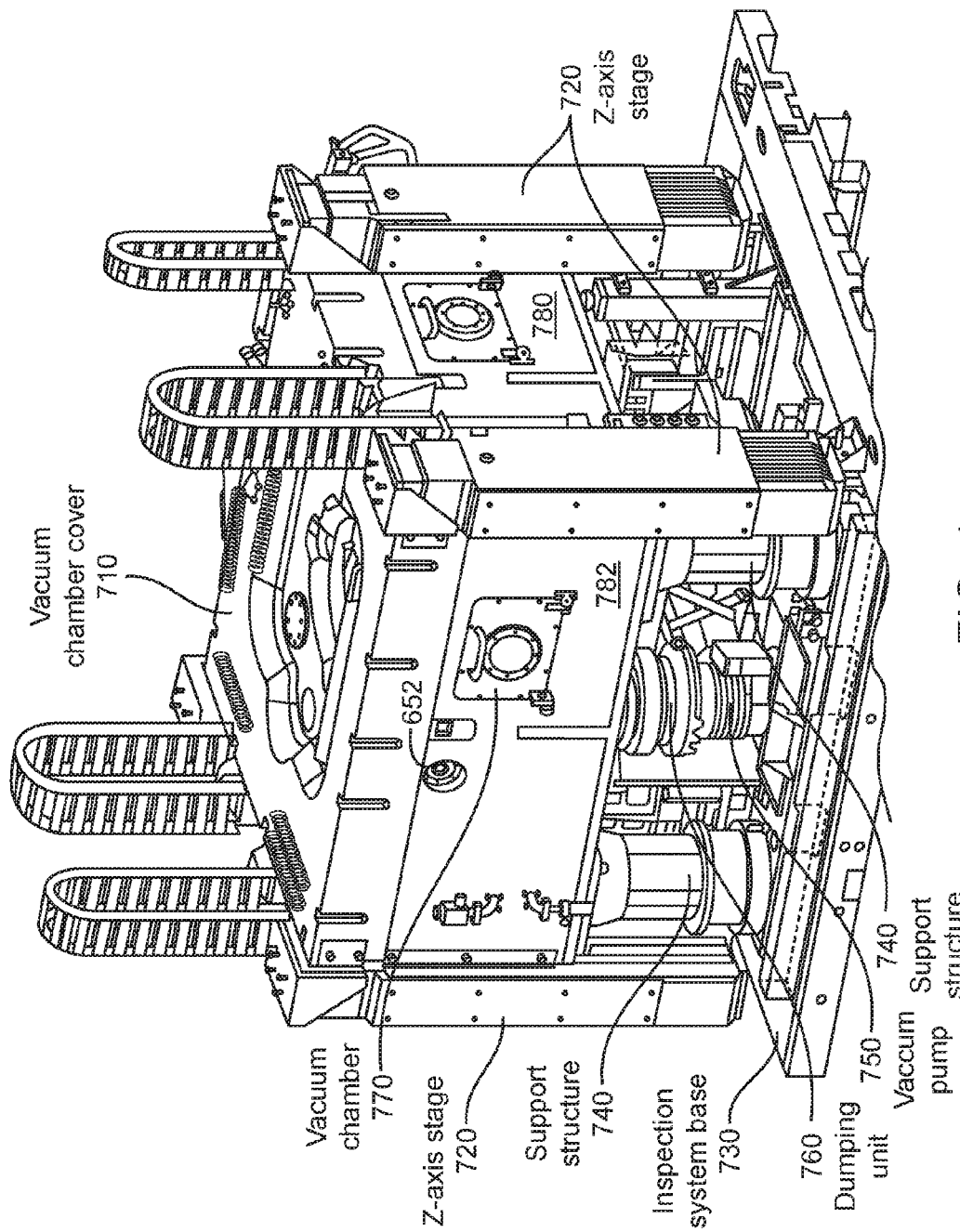
FIG. 4 illustrates the high voltage inspection system according to an embodiment.

FIG. 4 illustrates the high voltage inspection system 10 according to an embodiment.

The high voltage inspection system 10 includes interferometer window 652, vacuum chamber 700, a vacuum chamber cover 710, vacuum chamber sidewalls 780 and 782, Z-axis stages 720, inspection system base 730, support structures 740, vacuum pump 750, dumping unit 760 and vacuum chamber opening 770.

The vacuum chamber is supported by support structures 740. In FIG. 4 the support structures 740 have a cylindrical shape although other shapes may be used. The support structures 740 are positioned on the inspection system base 730. Any other frames of supporting structures may be provided. The support structures 740 may include or may be mechanically coupled to shock absorbers or damping units.

Vacuum pump 750 may introduce a desired vacuum level within the vacuum chamber. The vacuum may be introduced via one or more gas conduits (not shown) that enter the vacuum chamber. Vibrations generated by the vacuum pump 750 may be dumped by dumping unit 760.

The Z-axis stages 720 are positioned outside the vacuum chamber, are mechanically coupled to the vacuum chamber cover 710, and are configured to elevate the vacuum chamber cover 710 (thereby opening the vacuum chamber) or to lower the vacuum chamber cover 710 (thereby sealing the vacuum chamber). There may be a sealing mechanism between the vacuum chamber cover 710 and the sidewalls 780 and 782 of the vacuum chamber.

The vacuum chamber opening 770 may be a part of a load lock mechanism for inserting the substrate in the vacuum chamber and for extracting the substrate 20 from the vacuum chamber.

Figure 5:
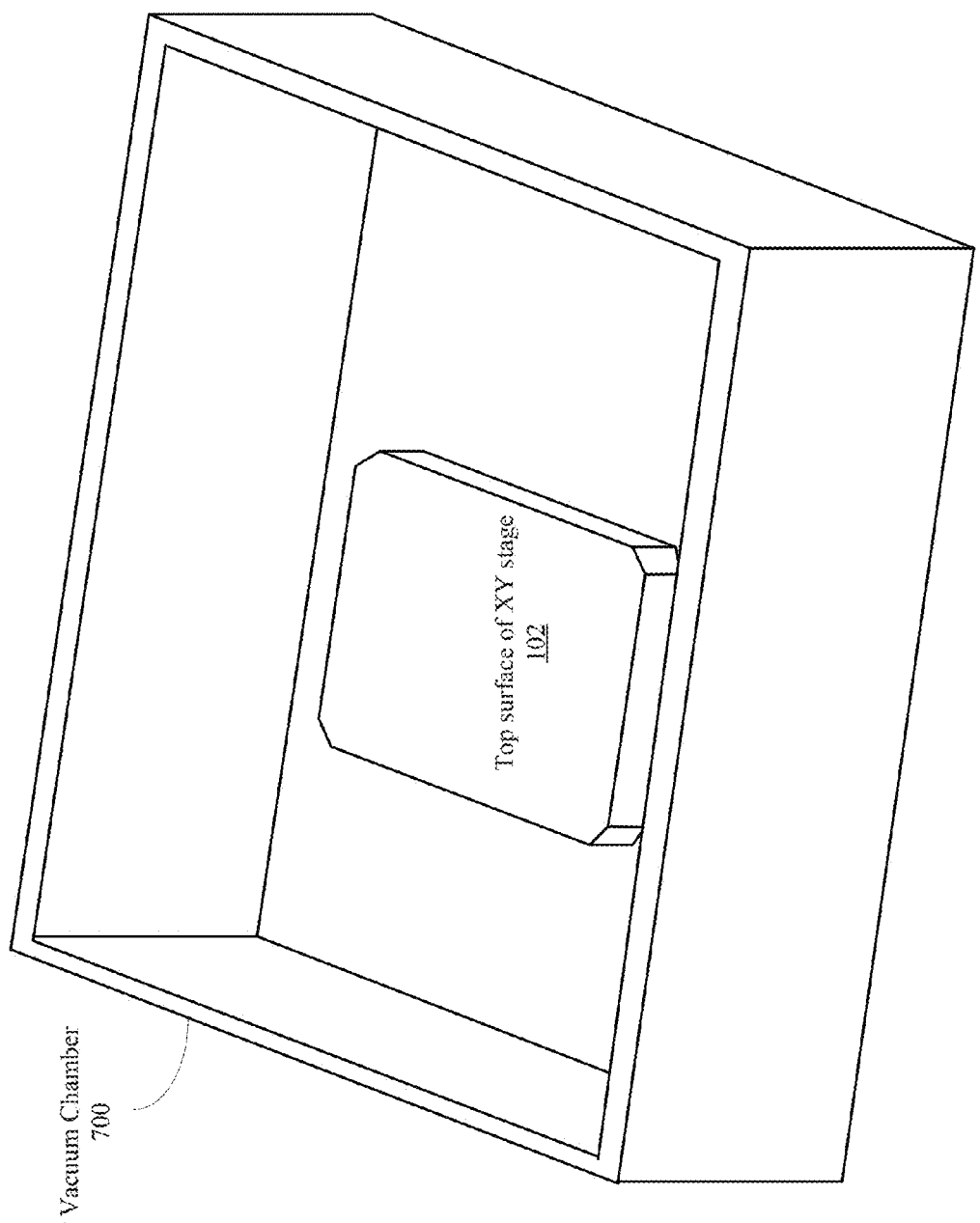
FIG. 5 illustrates the vacuum chamber and the top surface of the X-Y stage according to an embodiment.

FIG. 5 illustrates the vacuum chamber 700 and the top surface 102 of the X-Y stage. The top surface 102 is not smooth and is not exposed to the bottom conductive shield 310 in some embodiments.

Figure 6:
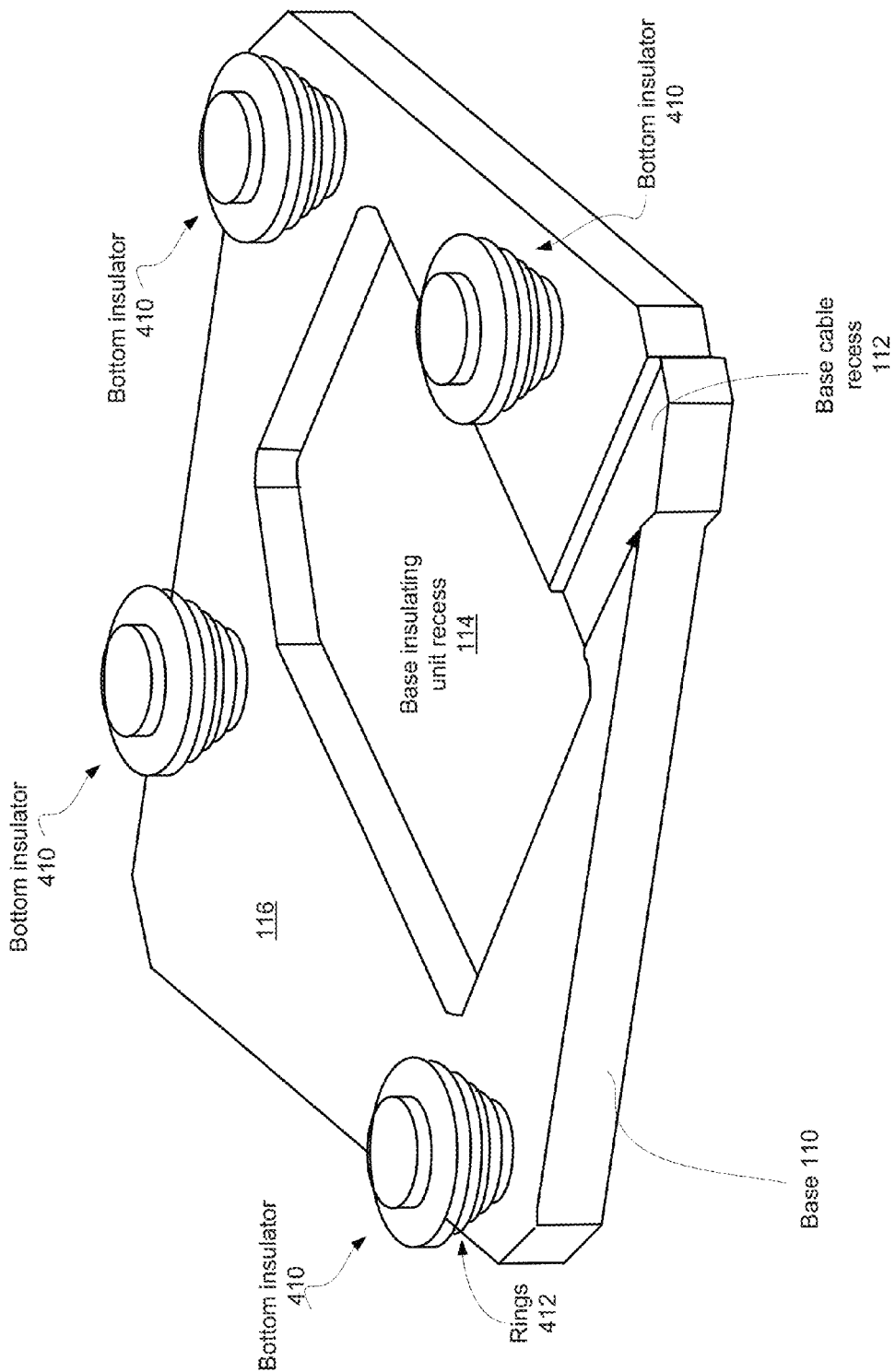
FIG. 6 illustrates base and bottom insulators according to an embodiment.

FIG. 6 illustrates the base 110 and bottom insulators 410 according to an embodiment.

The base 110 may include a smooth upper surface 116, a base insulating unit recess 114 and a base cable recess 112.

A cable guide (denoted 90 in FIG. 8) is placed on base cable recess 112. Insulating module 200 is placed on base insulating unit recess 114.

Bottom insulators 410 are connected between the smooth upper surface 116 and the bottom surface of the bottom conductive shield 310.

Figure 7:
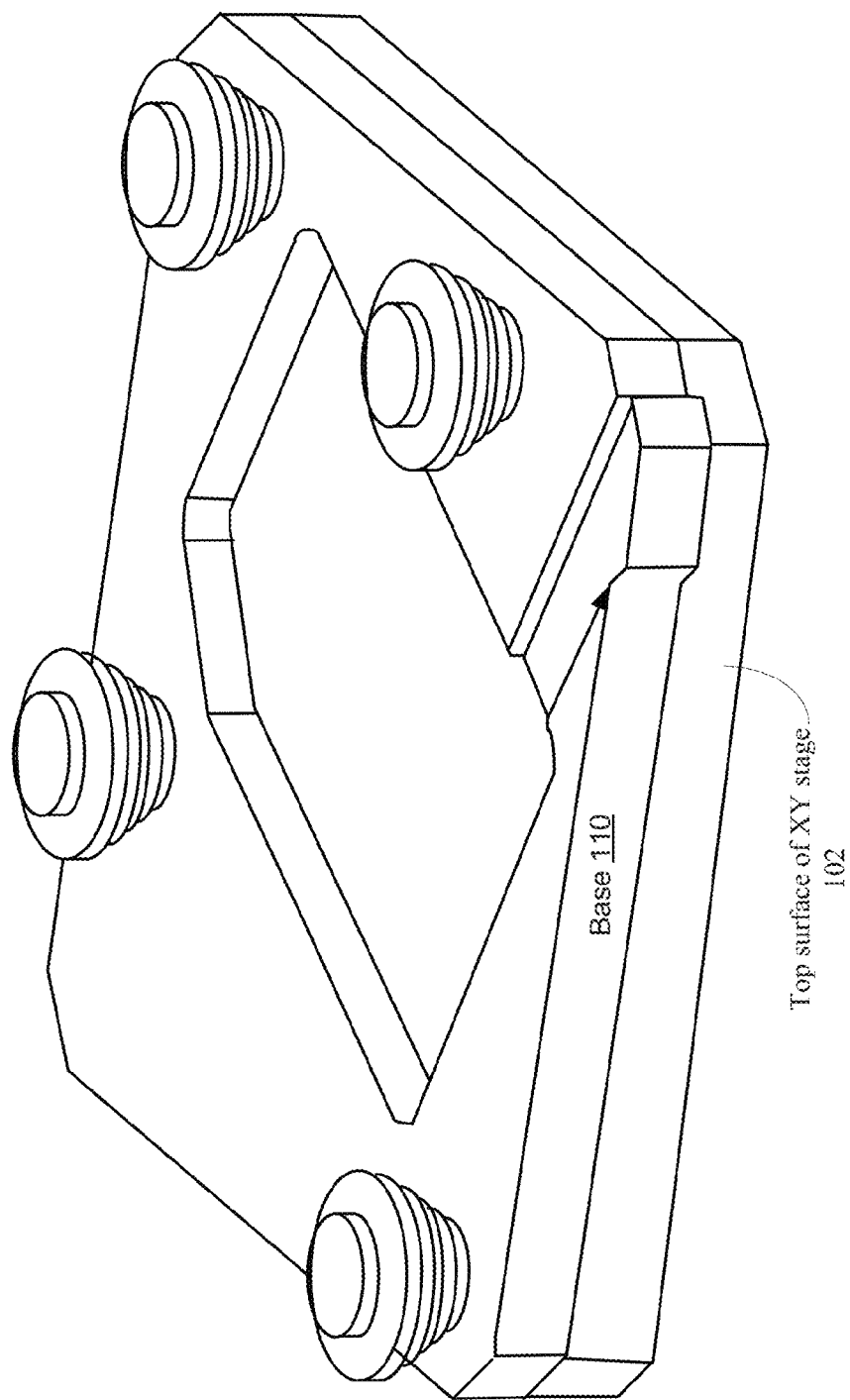
FIG. 7 illustrates a top surface, base, and bottom insulators according to an embodiment.

FIG. 7 illustrates top surface 102, base 110 and bottom insulators 410 according to an embodiment.

The base 110 may be positioned above the top surface 102 (of the X-Y stage) and conceal the top surface 102 from the bottom conductive shield 310.

Figure 8:
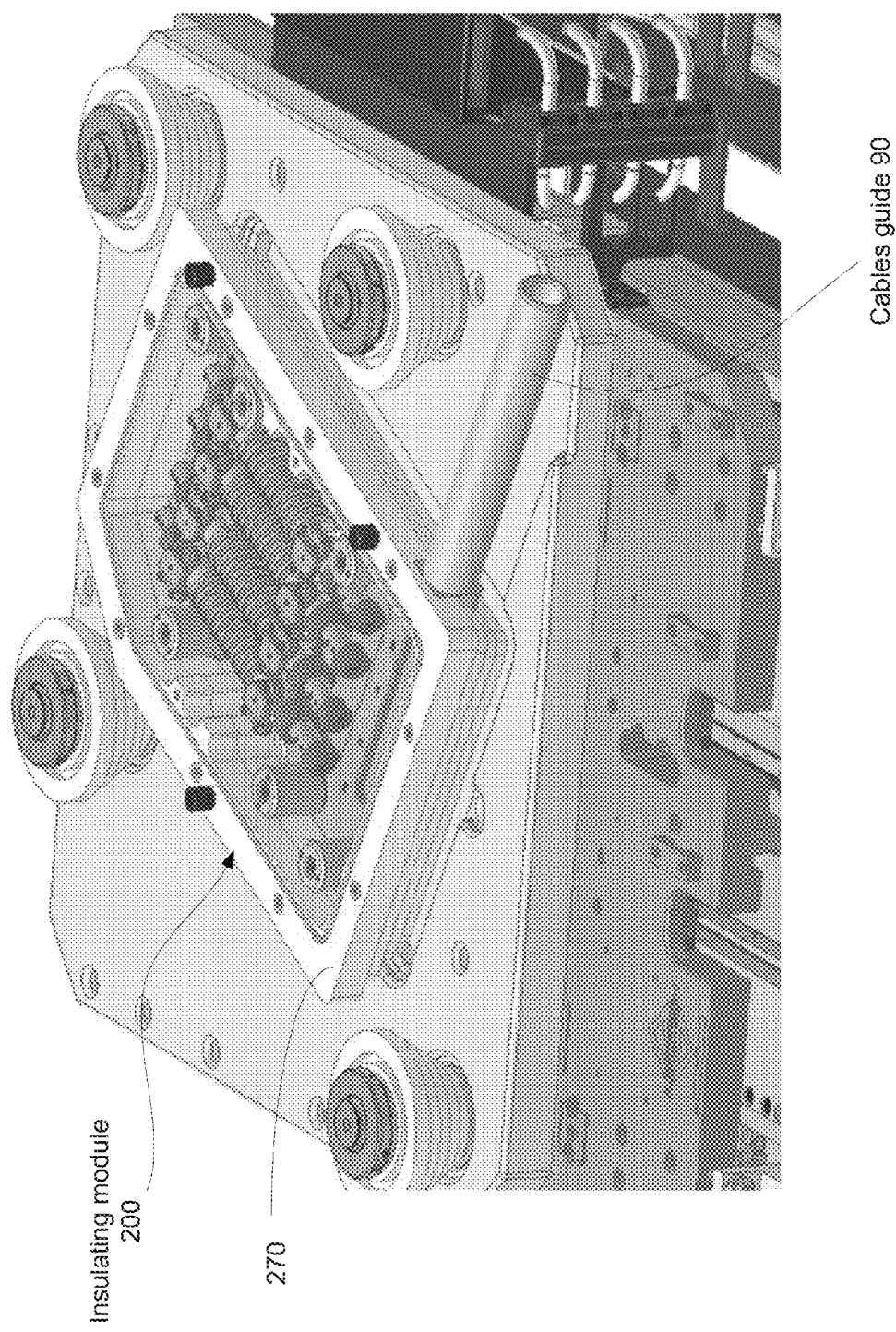
FIG. 8 illustrates a lower part of a housing of the insulating module and some components of the insulating module according to an embodiment.

FIG. 8 illustrates a lower part 270 of a housing of the insulating module 200 and some components of the insulating module 200 according to an embodiment.

The lower part 270 of the housing of the insulating module 200 is supported by the base insulating unit recess 114.

FIG. 8 also illustrates various components of the insulating module such as resistors, creepage reduction elements, input ports and a output ports. For brevity of explanation, the various components are numbered in FIGS. 14 and 15.

Figure 9:
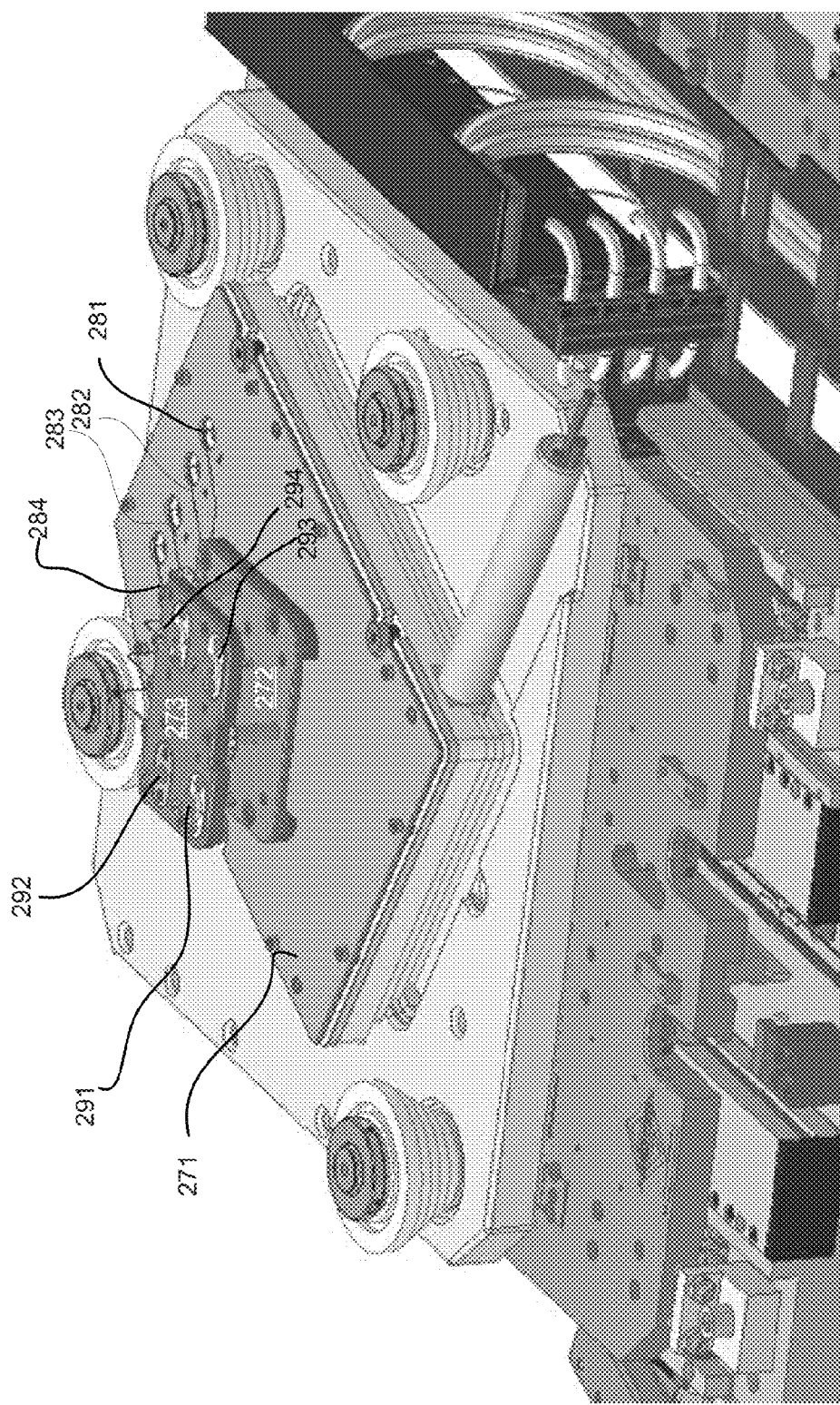
FIG. 9 illustrates a cover of the housing of the insulating module, cables, lower plate, upper plate and terminals according to an embodiment.

FIG. 9 illustrates a cover of the housing of the insulating module 200, cables 281, 282, 283 and 284, lower plate 272, upper plate 273 and terminals 291, 292, 293 and 294 according to an embodiment.

Holes may be formed in cover 270. Cables 281, 282, 283 and 284 from the output ports illustrated in FIG. 8 may pass through the holes and be connected to the inputs of terminals 291, 292, 293 and 294. Terminals 291, 292, 293 and 294 are secured to upper plate 273 that is positioned above (and connected to) lower plate 272. Lower plate 272 is secured to cover 270.

Cables 281, 282, 283 and 284 convey (a) the test signal that is sent to the chuck 330 in order to determine if there is a Ohamic contact between chuck 330 and substrate 20, (b) the bias signal of the given high voltage level, (c) the positive electrode bias signal, and (d) the negative electrode bias signal, respectively.

Figure 10:
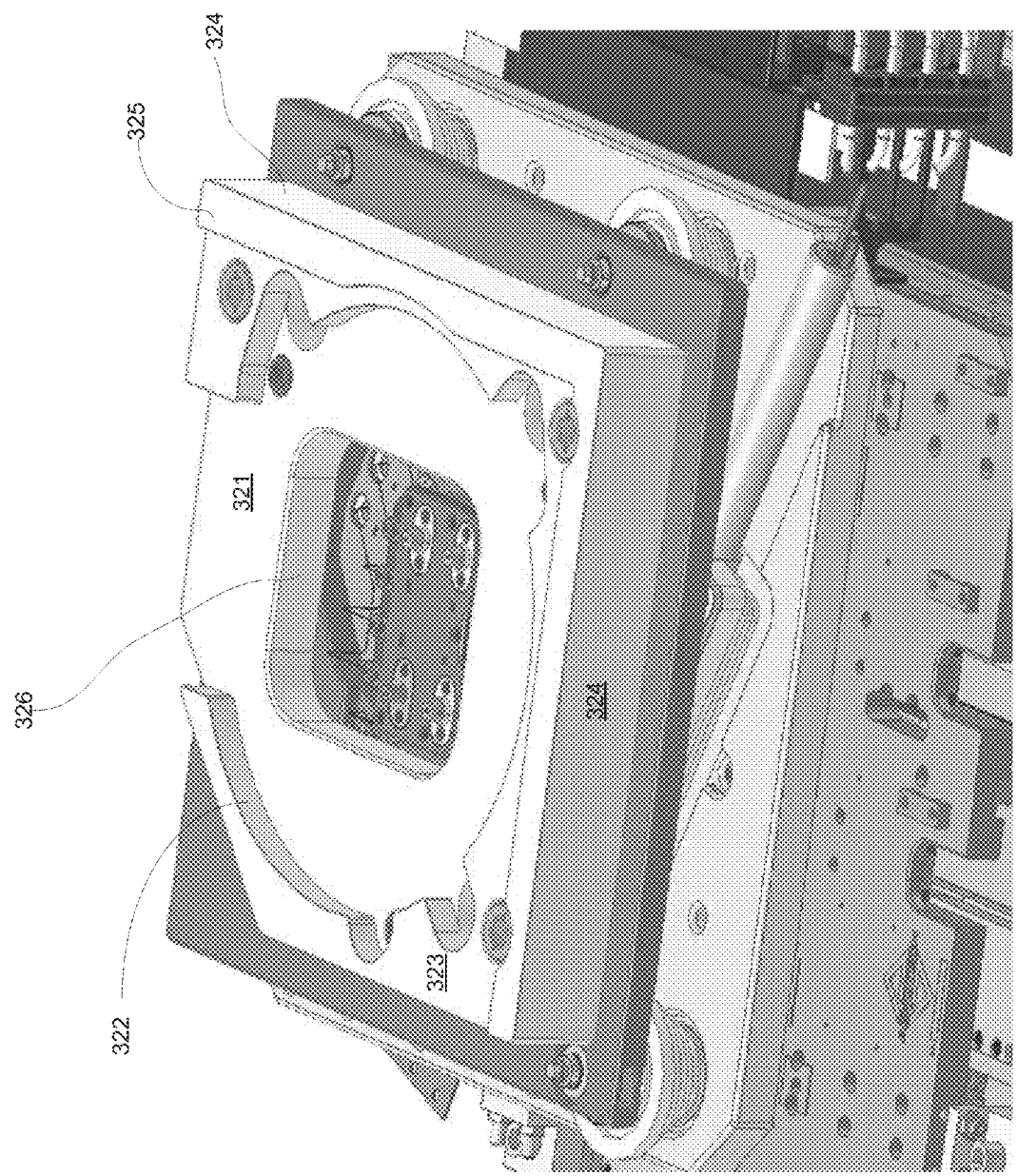
FIG. 10 illustrates that the bottom conductive shield is positioned below the housing and above the bottom insulators and base according to an embodiment.

FIG. 10 illustrates the X-Y stage 100, the base 110, the bottom insulators 410, the bottom conductive shield 310 and the housing 320 according to an embodiment.

FIG. 10 illustrates that the bottom conductive shield 310 is positioned below the housing 320 and above the bottom insulators 410 and the base 110.

The bottom conductive shield 310 includes an aperture that extends through the upper plate 273.

The housing 320 includes an aperture 326. Electrical cables that extend from one or more terminals 291, 292, 293 and 294 may pass through the aperture 326 and/or the aperture formed in the bottom conductive shield 310.

The housing 320 includes external sidewall 324 that may be coated by light reflecting material to form mirrors.

The housing 320 is illustrated as including a recess 321 on which the chuck 330 may be mounted. The recess 321 is surrounded by internal sidewall 322 that face the chuck 330 when the chuck is positioned on housing 320.

External sidewalls 342 may be slightly higher than the internal sidewalls. The external sidewalls 324 may end with an upper surface 325. The internal sidewalls 322 may end with upper surface 323.

Figure 11:
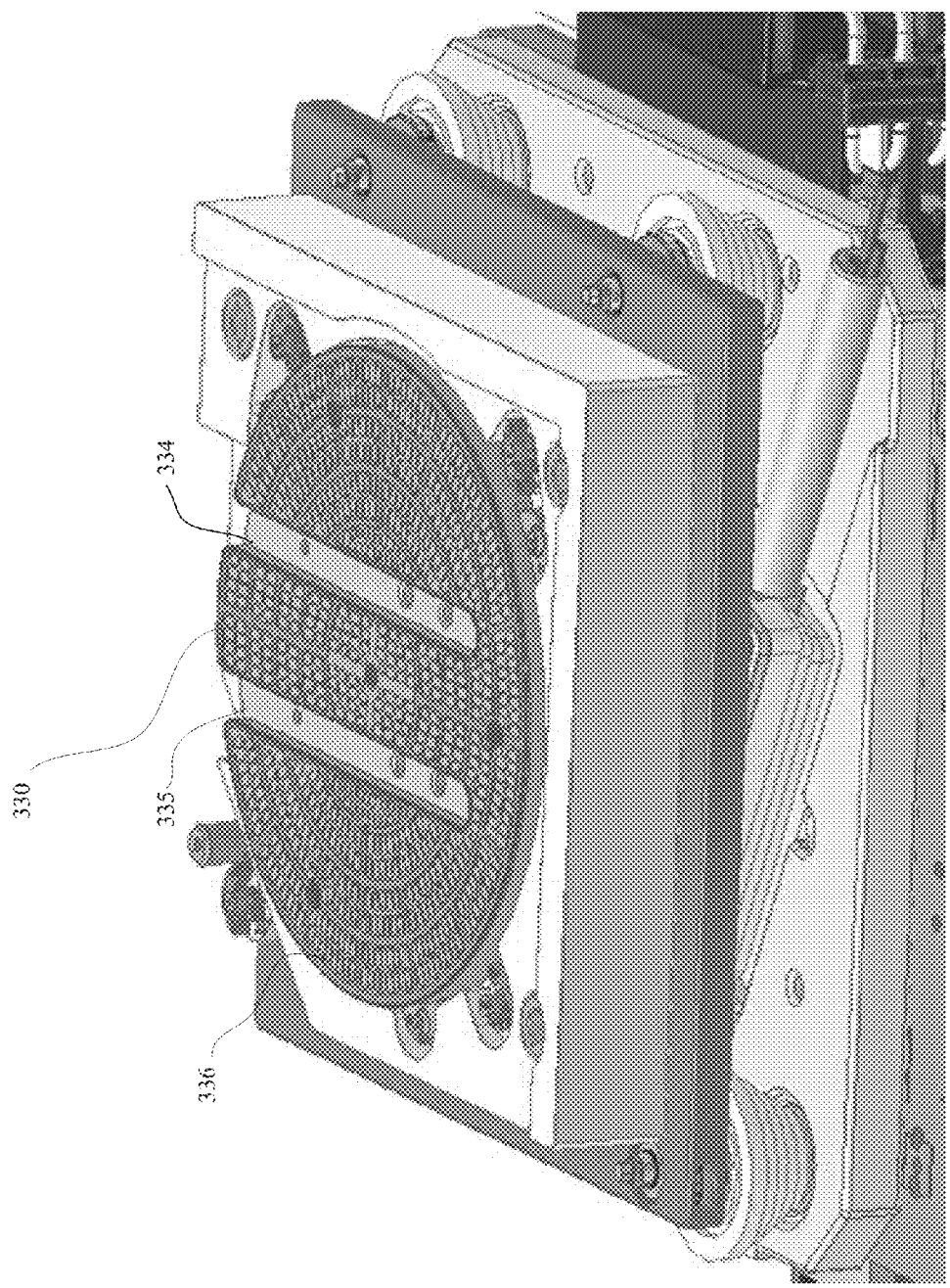
FIG. 11 illustrates a chuck, housing, bottom conductive shield and bottom insulators according to an embodiment.

FIG. 11 illustrates the chuck 330, the housing 320, the bottom conductive shield 310 and the bottom insulators 410 according to an embodiment.

The chuck 330 is positioned within the recess 321 of FIG. 10. The chuck 330 may not contact the internal sidewalls 322 of FIG. 10. Two chuck recesses 334 and 335 are shaped and sized to fit end effectors that supply the substrate 20 to the chuck 330. The upper surface of the chuck 330 is only exposed to the high voltage environment and thus can be unsmooth.

Figure 12:
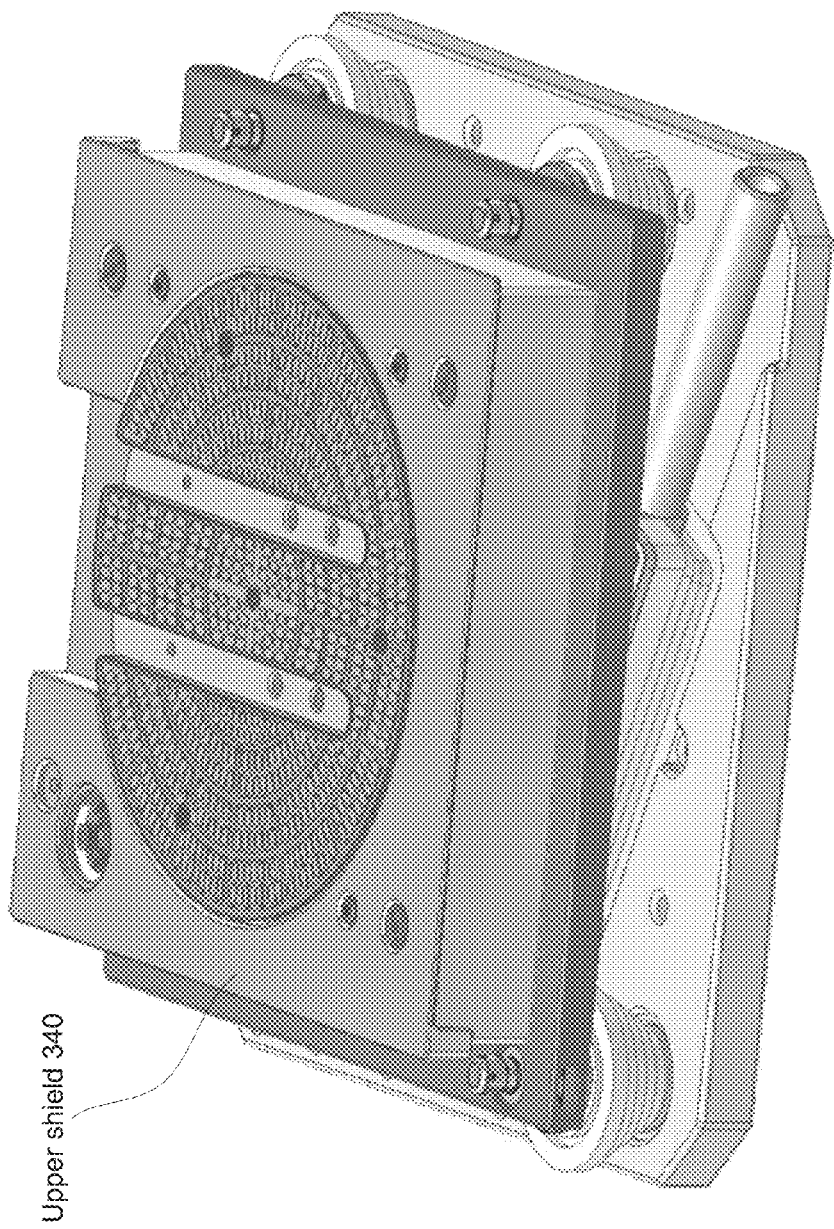
FIG. 12 illustrates an upper shield, chuck, housing, bottom conductive shield and bottom insulators according to an embodiment.

FIG. 12 illustrates the upper shield 340, the chuck 330, the housing 320, the bottom conductive shield 310 and the bottom insulators 410 according to an embodiment.

The upper shield 340 covers the upper parts of the housing 320. The upper shield 340 is electrically conductive and protects the housing 320 from mechanical damages.

Figure 13:
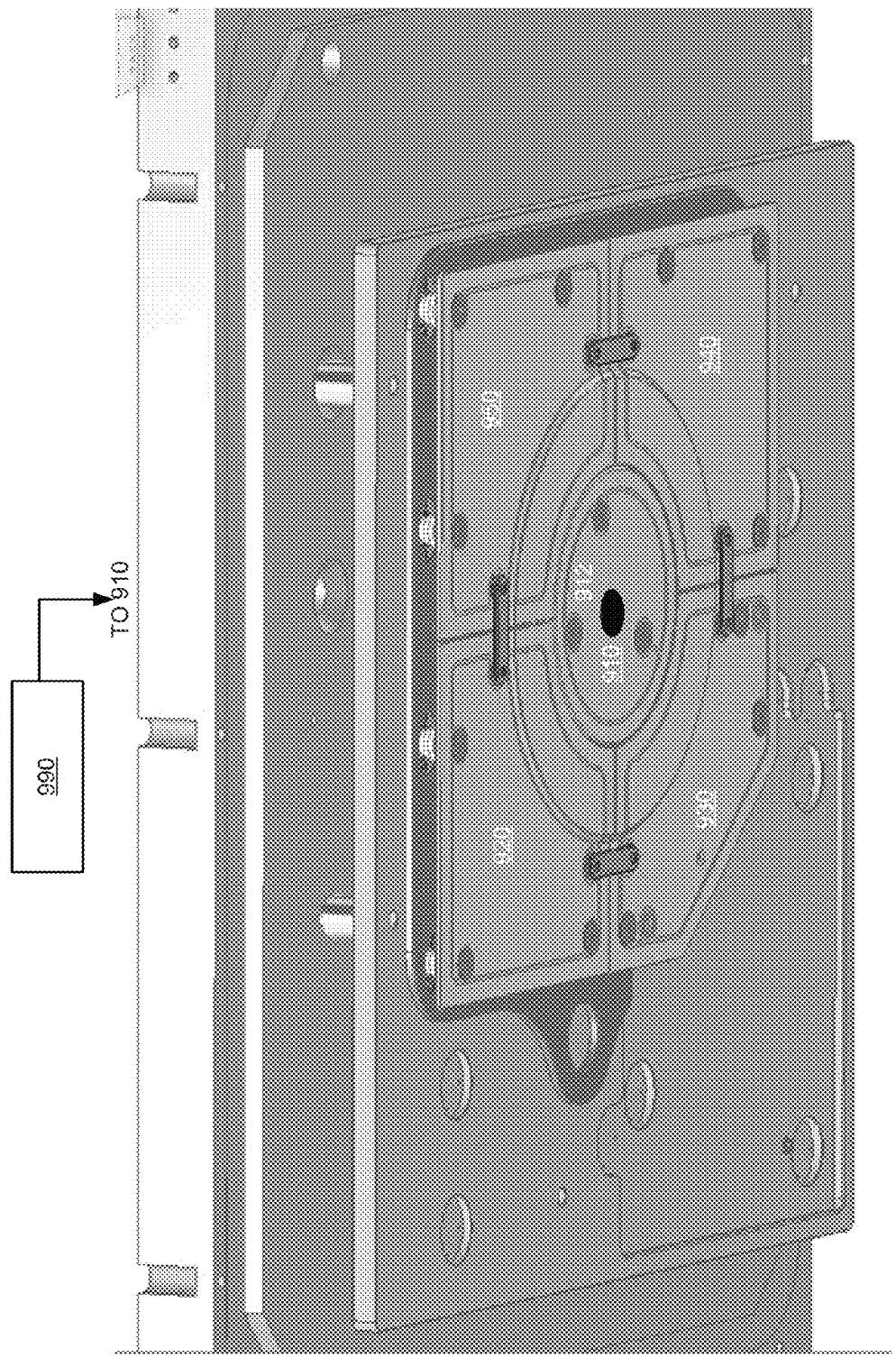
FIG. 13 illustrates the top conductive module according to an embodiment.

FIG. 13 illustrates the top conductive module 900 according to an embodiment.

The top conductive module 900 is illustrated as including an electron lens 910 that has an aperture 912 through which the electron beam (502 of FIG. 1) passes.

The top conductive module 900 also illustrates four additional conductive unit segments 920, 930, 940 and 950.

The segmenting of the top conductive module 900 may ease the installation and the carrying of the top conductive module 900.

The electron lens 910 may be fed by electron lens supply module 990 that is configured to introduce a difference between an electric potential of the electron lens and the high voltage level.

The top conductive module can be made of a ceramic material.

Figure 14:
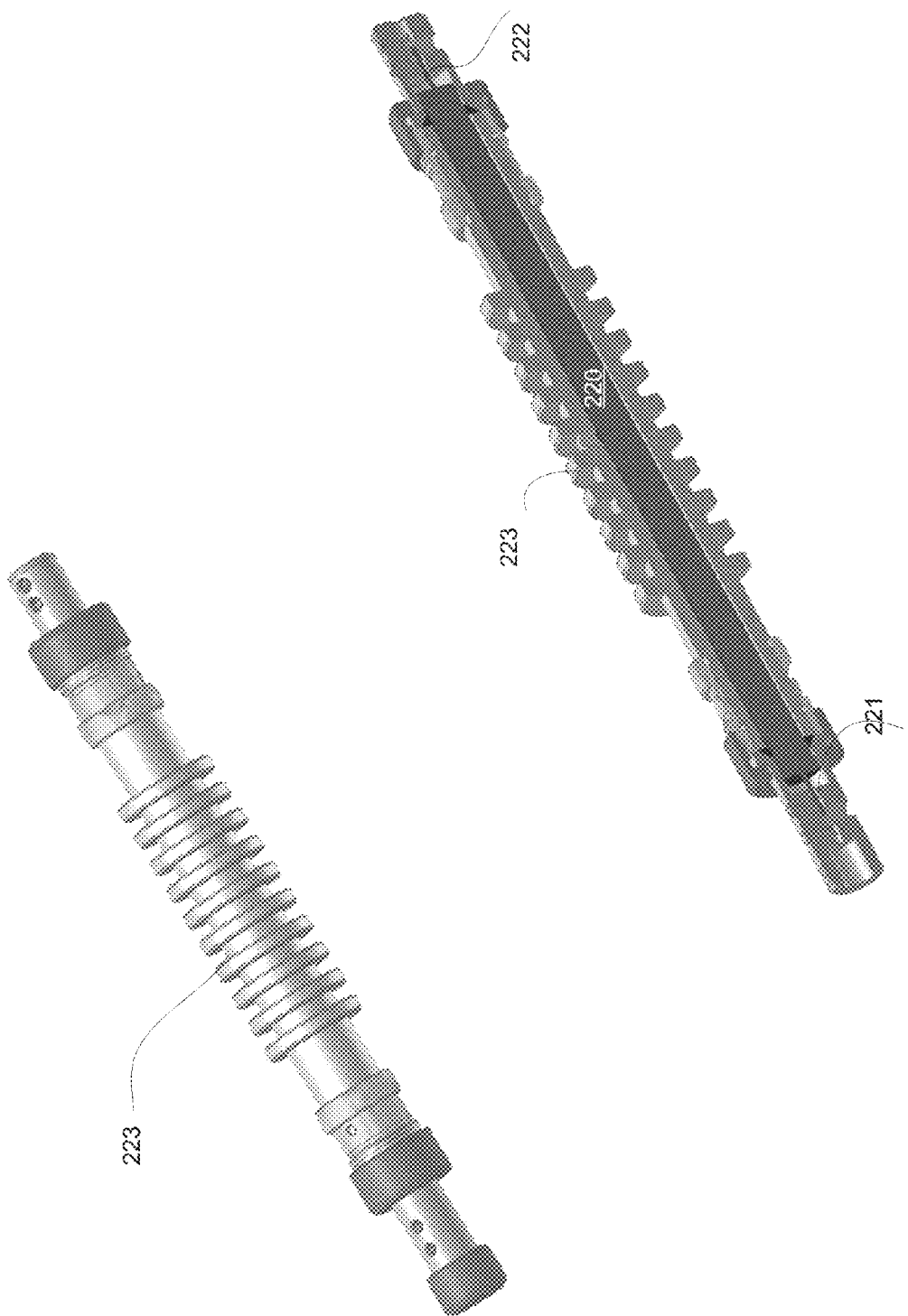
FIG. 14 includes a perspective view and a cross-sectional view of a resistor having a first port, a second port and a creepage reduction element according to an embodiment.
Figure 15:
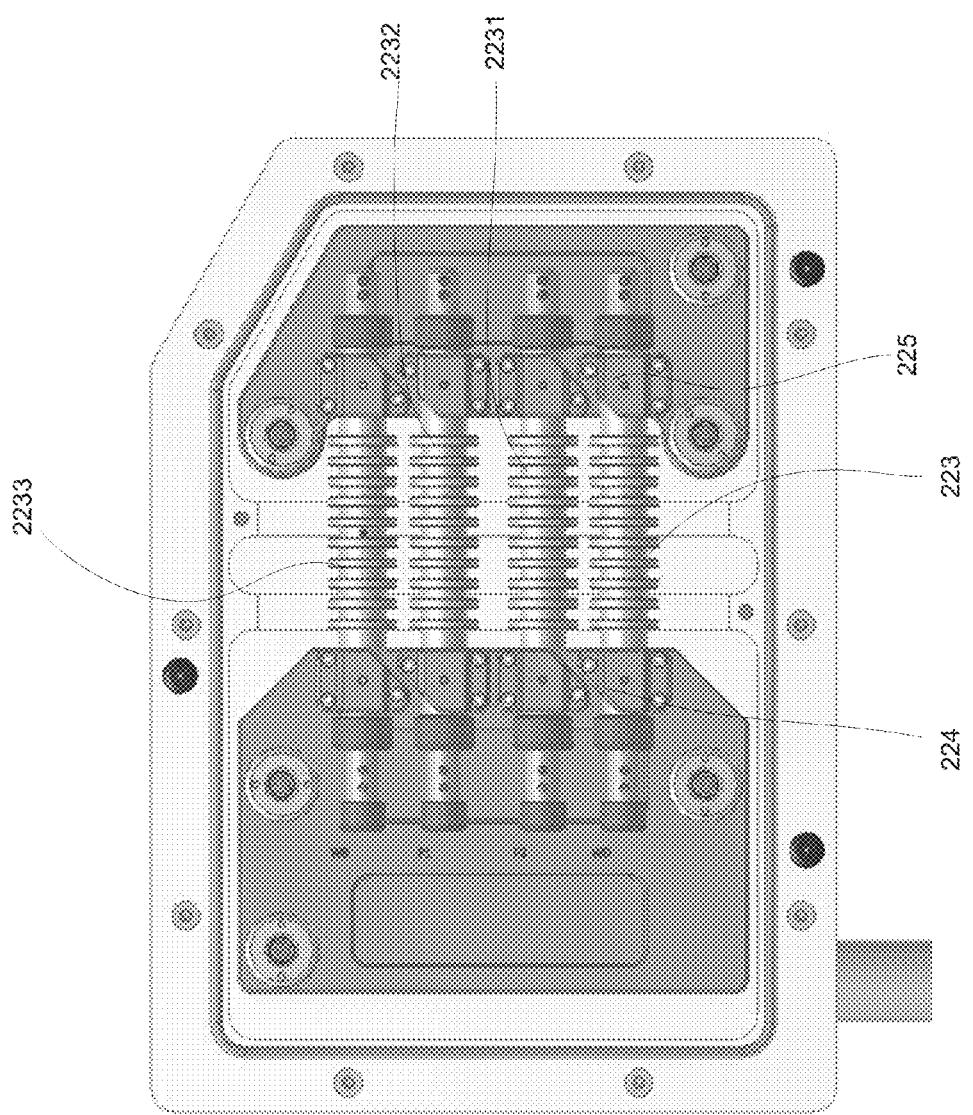
FIG. 15 illustrates the insulating module according to an embodiment.
Figure 16:
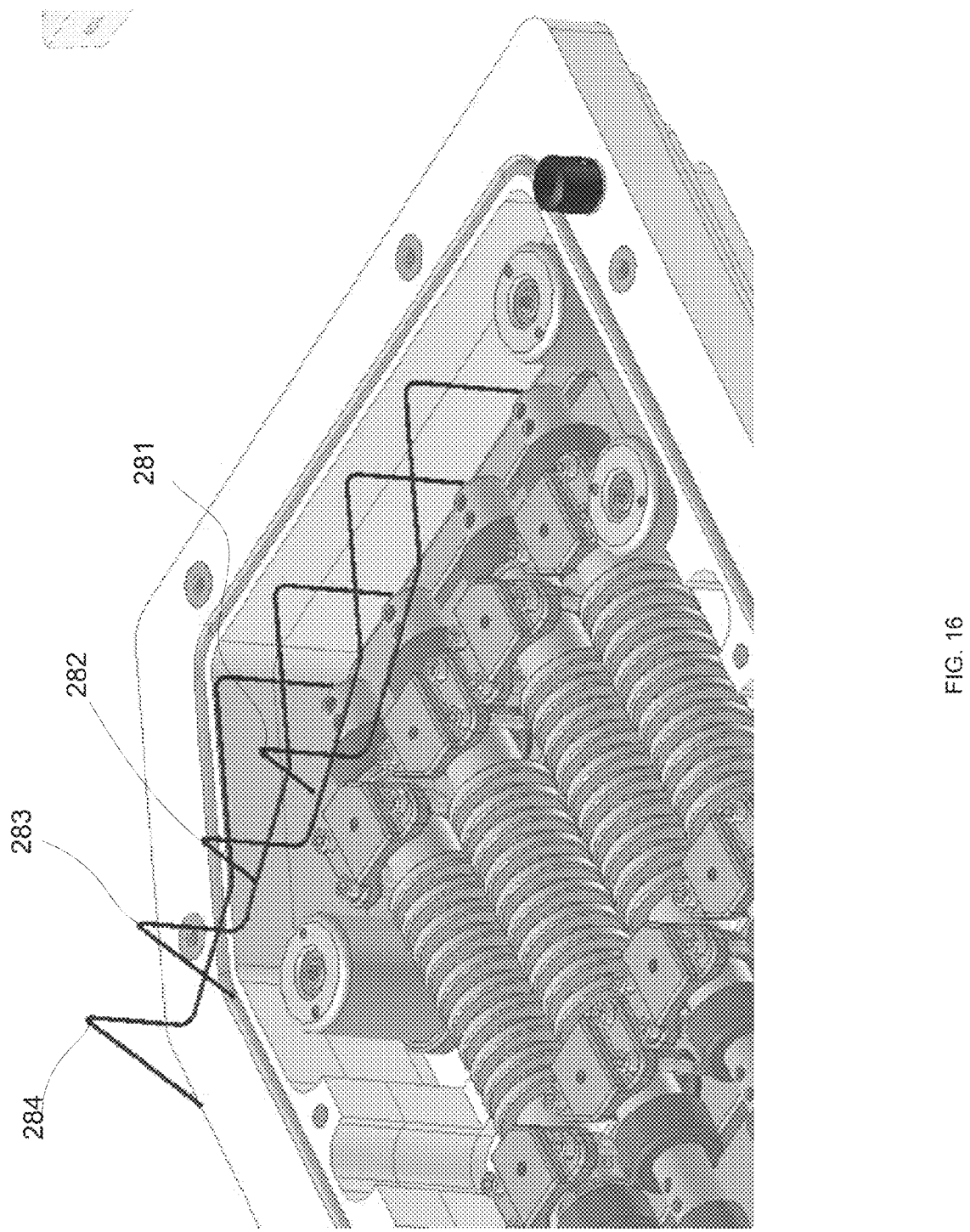
FIG. 16 illustrates the insulating module according to an embodiment.

FIG. 14 includes a perspective view and a cross-sectional view of a resistor 220 having a first port 221, a second port 222 and a creepage reduction element 223 according to an embodiment. FIGS. 15 and 16 further illustrate the insulating module 200 according to an embodiment.

The first port 221 is connected to an input port 224 of the insulating module 250. The input port 224 is electrically coupled to a first cable 251.

The second port 222 is connected to an output port 225 of the insulating module 250. The output port 225 is electrically coupled to cable 281 of FIG. 9.

Resistor 220 may be completely surrounded by creepage reduction element 223.

In FIG. 14, the creepage reduction element 223 includes multiple insulating rings of alternating radiuses. Other arrangements of rings of different sizes may be used.

The resistors may limit the current that flows through cables 250 if an arc occurs within the vacuum chamber.

One or more plasma openings may be positioned in any location within the vacuum chamber and allow plasma from an external plasma source to enter the vacuum chamber and to clean at least selected elements of the system.

In the foregoing specification, embodiments have been described with reference to specific examples. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments described herein are, for example, capable of step in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may be, for example, direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic, the signal is active low where the logically true state corresponds to a logic level zero. In the case of a positive logic, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described steps are merely illustrative. The multiple steps may be combined into a single step, a single step may be distributed in additional steps and steps may be executed at least partially overlapping in time. Moreover, alternative embodiments may include multiple instances of a particular step and the order of steps may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A high voltage inspection system, comprising:
a vacuum chamber;
electron optics that is configured to direct an electron beam towards an upper surface of a substrate;
a substrate support module that comprises a chuck and a housing;
wherein the chuck is configured to support a substrate;
wherein the housing is configured to surround the substrate without masking the electron beam, when the substrate is positioned on the chuck during a first operational mode of the high voltage inspection system; and
wherein the substrate, the chuck and the housing are configured to (a) receive a high voltage bias signal of a high voltage level that exceeds ten thousand volts, and (b) to maintain at substantially the high voltage level during the first operational mode of the high voltage inspection system.

2. The high voltage inspection system according to claim 1, further comprising a top conductive module that is positioned above the substrate support module without masking the electron beam; and wherein the top conductive module is configured to be maintained at the high voltage level during the first operational mode of the high voltage inspection system.

3. The high voltage inspection system according to claim 2, further comprising a mechanical stage that is electrically isolated from the substrate support module; wherein the mechanical stage is configured to introduce a movement between the substrate support module and the electron beam during the first operational mode of the high voltage inspection system; and wherein the top conductive module is positioned directly above the substrate during the movement between the substrate support module and the electron beam.

4. The high voltage inspection system according to claim 2, wherein the top conductive module comprises multiple conductive unit segments that are electrically coupled to each other.

5. The high voltage inspection system according to claim 2, wherein the top conductive module comprises an electron lens through which the electron beam passes and at least one additional conductive unit segment, and the high voltage inspection system further comprises an electron lens supply module that is configured to introduce a difference between an electric potential of the electron lens and the high voltage level.

6. The high voltage inspection system according to claim 2, wherein the top conductive module is made of a ceramic material.

7. The high voltage inspection system according to claim 2, wherein the top conductive module is mechanically coupled to a top surface of the vacuum chamber and is electrically insulated from the top surface of the vacuum chamber.

8. The high voltage inspection system according to claim 2, further comprising a top insulating interface that is configured to mechanically couple the top conductive module to the vacuum chamber, and wherein the top insulating interface comprises top insulators, and each top insulator comprises a set of coaxial insulators of descending size.

9. The high voltage inspection system according to claim 2, wherein the top conductive module is maintained at a millimetric distance from the substrate during the first operational mode of the high voltage inspection system.

10. The high voltage inspection system according to claim 1, further comprising a test circuit for checking a presence of an Ohmic contact between the chuck and the substrate.

11. The high voltage inspection system according to claim 1, further comprising an insulating module that is positioned between the substrate support module and a high voltage supply module, wherein the insulating module comprises resistors and creepage reduction elements; wherein each resistor is electrically coupled between an input port and an output port; wherein each resistor is surrounded by one of the creepage reduction elements, and wherein each creepage reduction element comprises multiple insulating rings of different sizes.

12. The high voltage inspection system according to claim 1, further comprising a bottom conductive shield that is configured to protect a bottom of the housing when the housing is positioned on top of the bottom conductive shield.

13. The high voltage inspection system according to claim 1, wherein the housing comprises a bottom conductive shield that is configured to protect a bottom of the housing.

14. The high voltage inspection system according to claim 1, wherein the housing comprises a conductive envelope; and wherein the conductive envelope comprises exterior parts that are made of a light reflecting material.

15. The high voltage inspection system according to claim 1, wherein the housing comprises a substantially non-expanding ceramic core, and wherein the housing comprises an upper shield that shields at least a part of an upper portion of the housing.

16. The high voltage inspection system according to claim 1, further comprising:
a bottom conductive shield that is configured to protect a bottom of the housing; and
a bottom insulating interface that is configured to electrically insulate the bottom conductive shield, wherein the bottom insulating interface comprises bottom insulators, and each bottom insulator comprises a set of coaxial insulating rings of ascending size.

17. The high voltage inspection system according to claim 1, further comprising a feedthrough module for supplying high voltage signals from a high voltage supply source positioned outside the vacuum chamber into the vacuum chamber, wherein the vacuum chamber comprises a first opening for receiving plasma from a plasma source located outside vacuum chamber; and wherein at least a part of the plasma that passes through the first opening is directed towards inner electrodes of the feedthrough module that are positioned within the vacuum chamber.

18. The high voltage inspection system according to claim 1, further comprising at least one plasma cleaning module that is configured to clean parts of the high voltage inspection system.

19. The high voltage inspection system according to claim 1, wherein the vacuum chamber comprises a first opening for receiving plasma from a plasma source located outside vacuum chamber; and wherein at least a part of the plasma that passes through the first opening is directed towards inner electrodes of a feedthrough module that are positioned within the vacuum chamber.

20. The high voltage inspection system according to claim 1, further comprising a top conductive module that is positioned above the substrate support module without masking the electron beam; wherein the top conductive module is configured to be maintained at the high voltage level during the first operational mode of the high voltage inspection system; wherein the vacuum chamber comprises a second opening for receiving plasma from a plasma source located outside the vacuum chamber; and wherein at least a part of the plasma that passes through the second opening is directed towards a lower surface of the top conductive unit.

* * * * *